United States Patent [19]

Butler et al.

[11] 4,070,600
[45] Jan. 24, 1978

[54] HIGH VOLTAGE DRIVER CIRCUIT

[75] Inventors: Walter J. Butler, Scotia; Charles W. Eichelberger, Schenectady, both of N.Y.

[73] Assignee: General Electric Co., Schenectady, N.Y.

[21] Appl. No.: 753,773

[22] Filed: Dec. 23, 1976

[51] Int. Cl.[2] ............... H05B 41/14; H03K 17/60; H03K 3/353
[52] U.S. Cl. ....................... 315/169 R; 307/270; 307/297; 315/169 TV; 340/324 M; 340/343; 307/DIG. 1
[58] Field of Search ............... 307/251, 270, DIG. 1, 307/296, 297; 315/169 R, 169 TV, 202; 340/324 M, 343

[56] References Cited
U.S. PATENT DOCUMENTS

| | | | |
|---|---|---|---|
| 3,600,631 | 8/1971 | Cake | 315/169 TV X |
| 3,742,294 | 6/1973 | Wojcik | 315/169 TV |
| 3,818,245 | 6/1974 | Suzuki et al. | 307/270 X |
| 3,867,646 | 2/1975 | McCoy | 307/DIG. 1 X |
| 4,032,818 | 6/1977 | Chan | 307/297 X |

Primary Examiner—Larry N. Anagnos
Attorney, Agent, or Firm—Geoffrey H. Krauss; Joseph T. Cohen; Jerome C. Squillaro

[57] ABSTRACT

A semiconductor switching circuit utilizes a relatively low breakdown voltage transistor for switching between a higher and a lower voltage by switching between a first conducting state of said transistor which is a "turned-on" state and a second state which is a "breakdown" state. The switching circuit is especially useful for the operation of display devices.

9 Claims, 4 Drawing Figures

HIGH VOLTAGE DRIVER CIRCUIT

BACKGROUND OF THE INVENTION

This invention is concerned in general with semiconductor switching circuits and more particularly to relatively high voltage switching circuits for use in conjunction with gas discharge display devices or the like. Gas discharge devices are conveniently employed for the presentation of information in conjunction with solid state control systems or the like. Conventional gas discharge displays require voltages on the order of 160 volts in order to reliably operate. It is desirable, in order to achieve the lowest possible cost, to provide drivers for the displays in the same technology as the circuits associated with the logic function or functions. Metal-oxide-semiconductor technology is increasingly becoming the standard for logic circuits in a wide variety of applications. The standard MOS process currently produces devices capable of switching voltages on the order of 30 to 40 volts. Clearly, these voltages are too low for the direct operation of gas discharge displays. While bipolar semiconductor devices are available which will readily provide the desired switching function, it is desirable to reduce the number of discrete devices required to perform the function and therefore the fabrication of all the required circuitry in accordance with a single technology, in order to minimize the number of components required, is required to achieve the lowest possible cost.

Accordingly, it is an object of this invention to provide a driver circuit capable of directly operating a gas discharge display device utilizing standard MOS processing.

It is another object of this invention to provide a driver circuit for gas discharge display devices which produces a relatively high voltage pulse waveform for use in circuits ancillary to the display system.

SUMMARY OF THE INVENTION

Briefly stated, and in accordance with one aspect of the present invention, a semiconductor switching circuit for switching between two voltages includes a first transistor having a breakdown voltage essentially equal to the difference between the two voltages which breakdown voltage is less than the higher of the two voltages and control means for switching the transistor between a conducting state when the transistor is turned on and a breakdown state when the transistor is turned off. In accordance with a presently preferred embodiment of this invention, the first transistor is a metal-oxide-semiconductor field effect transistor having gate source and drain electrodes. A semiconductor diode is advantageously provided between the gate and source electrodes of the MOS field effect transistor for maintaining, through the mechanism of leakage, the gate voltage at a voltage equal to the voltage applied to the source electrode. Further, and in accordance with a preferred embodiment of this invention, the MOS-FET is fabricated on a semiconductor substrate including a junction between the drain electrode and the substrate for maintaining, through the mechanism of leakage, the drain electrode at a voltage near the voltage applied to the source electrode.

In further accordance with a preferred embodiment of this invention, control signals are electrically coupled to the gate electrode from control circuitry which may be operated at an arbitrarily selected voltage different from the operating voltage of the aforesaid switching circuit, by capacitive means for providing DC isolation between the circuit portions. Conveniently, the capacitive coupling means may be provided upon the same semiconductor substrates as the high voltage switching portion and control portions of a circuit in accordance with this invention.

BRIEF DESCRIPTION OF THE DRAWINGS

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

DETAILED DESCRIPTION OF THE DRAWINGS

Figure 1:
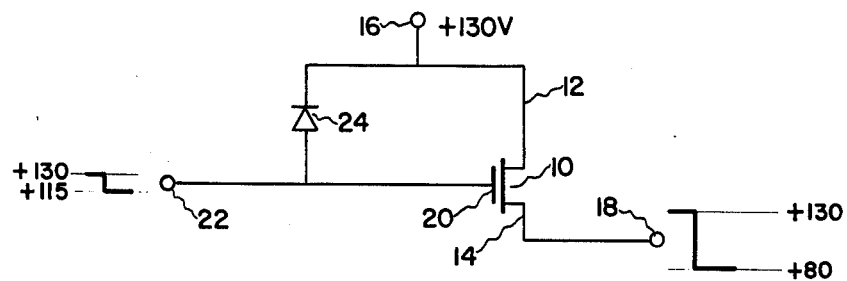
FIG. 1 is a schematic diagram of the high voltage switching portion of a gas discharge driver circuit in accordance with this invention.

Referring now to FIG. 1, there is illustrated in schematic form a high voltage semiconductor driver in accordance with one aspect of this invention. Transistor 10 includes source electrode 12 and drain electrode 14. Source electrode 12 is connected to terminal 16 which is adapted to be connected to a source of high voltage as, for example, 130 volts as illustrated. Drain electrode 14 is connected to output terminal 18 which is connected to the device to be driven. Gate electrode 20 is connected to input terminal 22 and also to the anode of diode 24, the cathode of which is connected to terminal 16. In accordance with this invention, transistor 10 is selected to have a breakdown voltage less than the voltage applied to terminal 16. In accordance with an exemplary embodiment of this invention, a breakdown voltage of 50 volts will be presumed. Further, although not illustrated, it will be presumed that transistor 10 is fabricated on a substrate as is conventional for monolithic integrated circuits, and that the substrate is connected to the same source of voltage connected to terminal 16. In this way, leakage currents will maintain drain electrode 14 at 130 volts in the absence of a load connected to terminal 18. Similarly, diode 24 which is connected in the blocking direction between terminal 16 and gate electrode 20 maintains voltage at electrode 20 at 130 volts in the absence of a signal connected to terminal 22.

Figure 2:
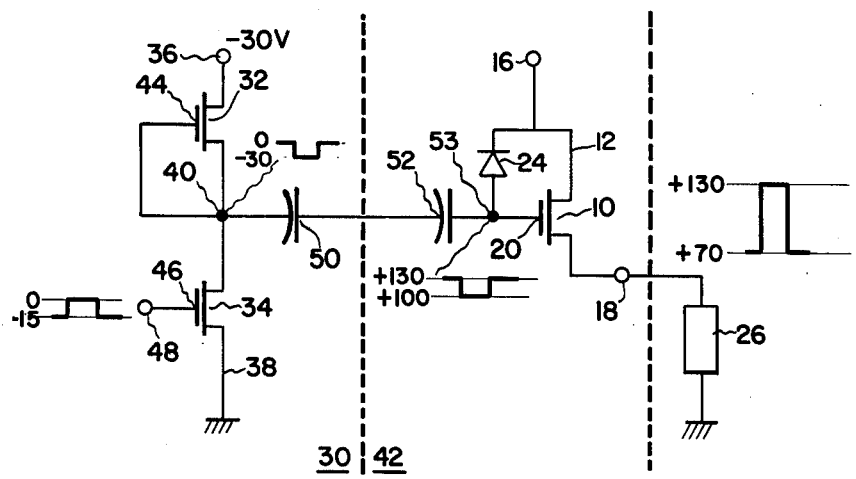
FIG. 2 is a schematic diagram of an anode driver circuit for a gas discharge display tube or the like including a high voltage and a control portion.

The waveform diagrams proximate input terminal 22 and output terminal 18 illustrate the voltages appearing thereat during the two conditions of transistor 10. Reference may now be made to FIG. 2 wherein a more complete anode driver for a display device in accordance with this invention is illustrated. Like reference numerals designate elements corresponding to like numbered elements of FIG. 1. In addition to the elements of FIG. 1, the circuit of FIG. 2 includes a display device 26 which may conveniently be a gas discharge display device and a driver circuit 30 including first and second transistors 32 and 34 connected in series relationship between terminal 36 which is adapted to be connected to a source of operating voltage and ground 38. The junction of transistors 32 and 34 is designated terminal 40 and is connected as will be described to the high voltage driver portion 42 of the display driver in accordance with this invention. Transistor 32 includes gate electrode 44 which is connected to terminal 40. Gate electrode 46 of transistor 34 is connected to terminal 48 which is adapted to be connected to a source of controlling signals for the display driver. In operation, circuit portion 30 of the embodiment of this invention illustrated at FIG. 2 provides a signal at node 40 which is essentially at ground potential whenever transistor 34 is on which condition is satisfied, for a p-channel device, by the application of a negative voltage to gate 48 as illustrated by $-15$ volt condition of the waveform proximate terminal 48. Similarly, when transistor 34 is off as, for example, when a zero volt signal is applied to terminal 48, node 40 increases to $-30$ volts, the voltage applied to terminal 36. The change in voltage at node 40 is coupled to gate 20 of transistor 10 by capacitors 50 and 52. While two capacitors are utilized in the embodiment of this invention as illustrated at FIG. 2, for the purposes to be hereinbelow described, it will be appreciated by those skilled in the art that a single capacitor or in an appropriate case no capacitor at all might readily be employed. It will be recalled from the discussion of FIG. 1 that in the absence of a signal control means 30, node 53 which corresponds to terminal 22 rises to the voltage applied to terminals 16 viz. 130 volts in this case, due to the leakage of diode 24 in the reverse direction. The impedance of diode 24 is, of course, high and therefore when a change in voltage occurs at node 40 as, for example, when the signal applied to terminal 48 changes state turning transistor 34 from off to on or vice versa, a like change in voltage occurs at node 53. For example, in a manner similar to that described in conjunction with FIG. 1 a change in voltage at node 53 from 130 volts to 100 volts occurs as the voltage at node 40 changes from zero volts to $-30$ volts. The change in voltage which is detected at gate electrode 20 causes transistor 10 to turn on thereby raising the voltage at terminal 18 to 130 volts, the voltage applied to terminal 16. It will be understood by those skilled in the art that leakage currents prevent the maintanance of the on state of transistor 10. Accordingly, a circuit in accordance with this invention is especially well suited to multiplexed display driver applications wherein a plurality of displays are driven by a single driver in sequence. In the other operating condition which is established as the voltage at node 40 switches from $-30$ volts to zero volts, a similar change in voltage occurring at node 53, transistor 10 is turned off. As was hereinabove described, transistor 10 is selected to have a breakdown voltage less than the voltage applied to terminal 16. Accordingly, the voltage across transistor 10, specifically the voltage between source electrode 12 and drain electrode 14, increases beyond the breakdown voltage of the device and breakdown occurs. As breakdown occurs, the voltage at node 18 is determined primarily by the breakdown voltage of transistor 10 and the characteristics of load 26 attached to terminal 18. In accordance with a preferred embodiment of this invention, wherein load 26 is a gas discharge display device, the voltage at terminal 18 will be the voltage applied to terminal 16 less the breakdown voltage of transistor 10. This voltage is preferably selected to be less than the voltage necessary to ignite the gas discharge device, thereby providing an off condition for the device.

It will seen that the circuit of FIG. 2 provides for the switching of load device 26 between off and on conditions utilizing semiconductor devices which may be manufactured solely in accordance with MOS technologies providing devices having a breakdown voltage greater than the differential voltage between the supply and the voltage required to ignite the device. In accordance with a presently preferred embodiment of this invention, a control portion 30 of the circuit of FIG. 2 is fabricated on one integrated circuit device while high voltage portion 42 is fabricated on a separate device isolated from control portion 30. Insofar as capacitors 50 and 52 provide no DC connection between the devices, isolation is maintained. Preferably, capacitors 50 and 52 may be formed on the isolated devices as illustrated, capacitor 50 being integrally formed with device 30 while capacitor 50 is formed with device 42. It will be understood by those skilled in the art that achieving the required breakdown voltages for capacitors 50 and 52 is readily accomplished. Where desired, a single capacitor may be fabricated on one or the other of the two semiconductor portions of the device having a sufficient breakdown voltage to provide substantially all of the isolation required. Where this is done, one or the other of capacitors 50 or 52 may be eliminated. Additionally, both capacitors may be replaced, when desired by a single external capacitor of appropriate voltage rating.

Figure 3:
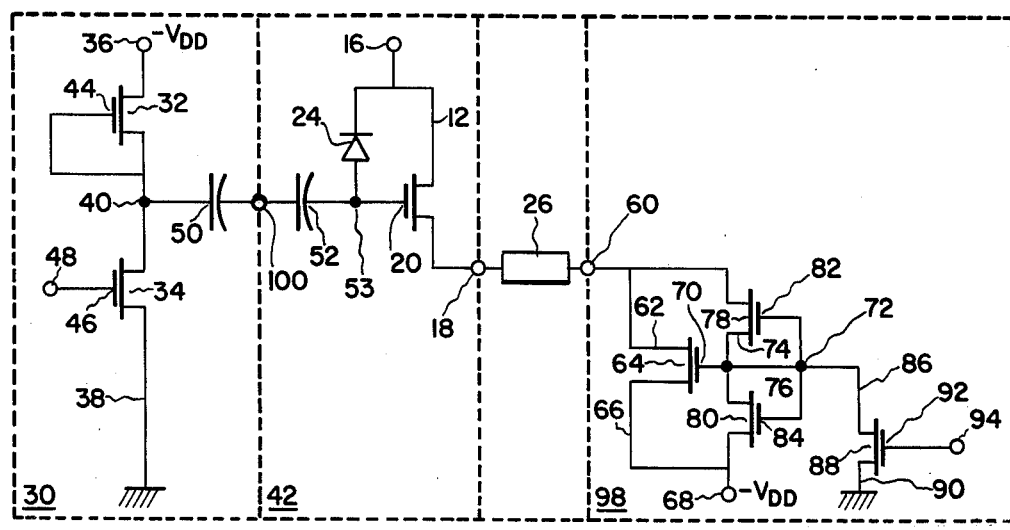
FIG. 3 is a schematic diagram of a gas discharge display system including both anode and cathode circuits.

There is illustrated at FIG. 3 a substantially complete schematic diagram of a driver circuit in accordance with this invention for operating a gas discharge display device 26. Both anode and cathode driver circuits are illustrated, the anode circuits being substantially those of FIG. 2 and the cathode circuit being those described in co-pending United States patent application Ser. No. 753,772. The circuit of FIG. 3 is especially well suited for controlling a segmented display device, it being understood that a plurality of circuits equal to the number of segments desired to be operated would be required. Further, it will be appreciated by those skilled in the art that a multiplexed mode of operation may be preferred wherein the segments which are desired to be illuminated are not, in fact, continuously illuminated but rather are illuminated during a portion of the time illumination is required at a rate sufficiently rapid that the illumination appears to be continuous. A cathode terminal 60 of display device 26 is connected to drain electrode 62 of transistor 64. Source electrode 66 of which is connected to a terminal 68 which is adapted to be connected to a source of anode voltage $-V_{DD}$ which may conveniently be on the order of $-30$ volts. Gate electrode 70 of transistor 64 is connected to node 72 which is the common connection of source and drain electrodes 74 and 76, respectively, of transistors 78 and 80, gate electrodes 82 and 84 which are also connected to node 72. Node 72 is further connected to drain electrode 86 of transistor 88, source electrode 90 of which is connected to ground. Gate electrode 92 of transistor 88 is connected to terminal 94 which is the control signal input terminal for the cathode driver portion of the device. Transistor 78 is preferably an enhancement mode field effect transistor while transistor 80 is a depletion mode device. The operation of cathode driver 98 of FIG. 3 is completely described in the aforementioned co-pending United States patent application of common assignee herewith which is hereby incorporated by reference. Briefly, however, the operation of cathode driver 98 is controlled by the application of signals to terminal 94 thereof. When transistor 88 is turned off, node 72 is substantially isolated and a voltage is maintained thereat which is, to a first approximation, substantially constant with respect to changes in $-V_{DD}$ and with respect to the voltage present at terminal 60. The voltage developed at node 72 is applied to gate electrode 70 which thereby provides for a substantially constant current flow between terminals 60 and 68. This is especially advantageous in the case of gas discharge displays which are preferably operated at a constant current. The application of a signal to terminal 94 to turn on transistor 88 grounds gate terminal 70 of transistor 64 and turns off display device 26.

In accordance with a preferred embodiment of this invention, a number of display devices 26 may be connected in a matrix arrangement organized in rows and columns, an anode driver 42 being provided for each column and a cathode driver 98 for each row in order to minimize the number required. This arrangement of display devices is well known in the art, this invention provides new and improved drivers only.

In further accordance with this invention, cathode driver 98 may be fabricated from a common integrated circuit device with control portion 30 of anode driver 42. The voltages for the operation of the two portions being substantially similar, it being understood that $-V_{DD}$ may conveniently be on the order of $-30$ volts. As was hereinbefore described, anode driver circuit 42 is preferably fabricated on a separate isolated integrated circuit structure. It will be seen by reference to FIG. 3 and with respect to the foregoing explanation that an integrated driver for a gas discharge display device may readily be provided in a form requiring no external components and therefore at minimum cost. Further, the complexities associated with the assembly of devices of this type are reduced to a minimum since the number of physical components is likewise minimized. It will be seen by reference to FIG. 3 that two integrated semiconductor devices each containing a plurality of circuits for driving a like plurality of devices may be provided which require no external components save the display devices themselves and would further require connections only between themselves.

Figure 4:
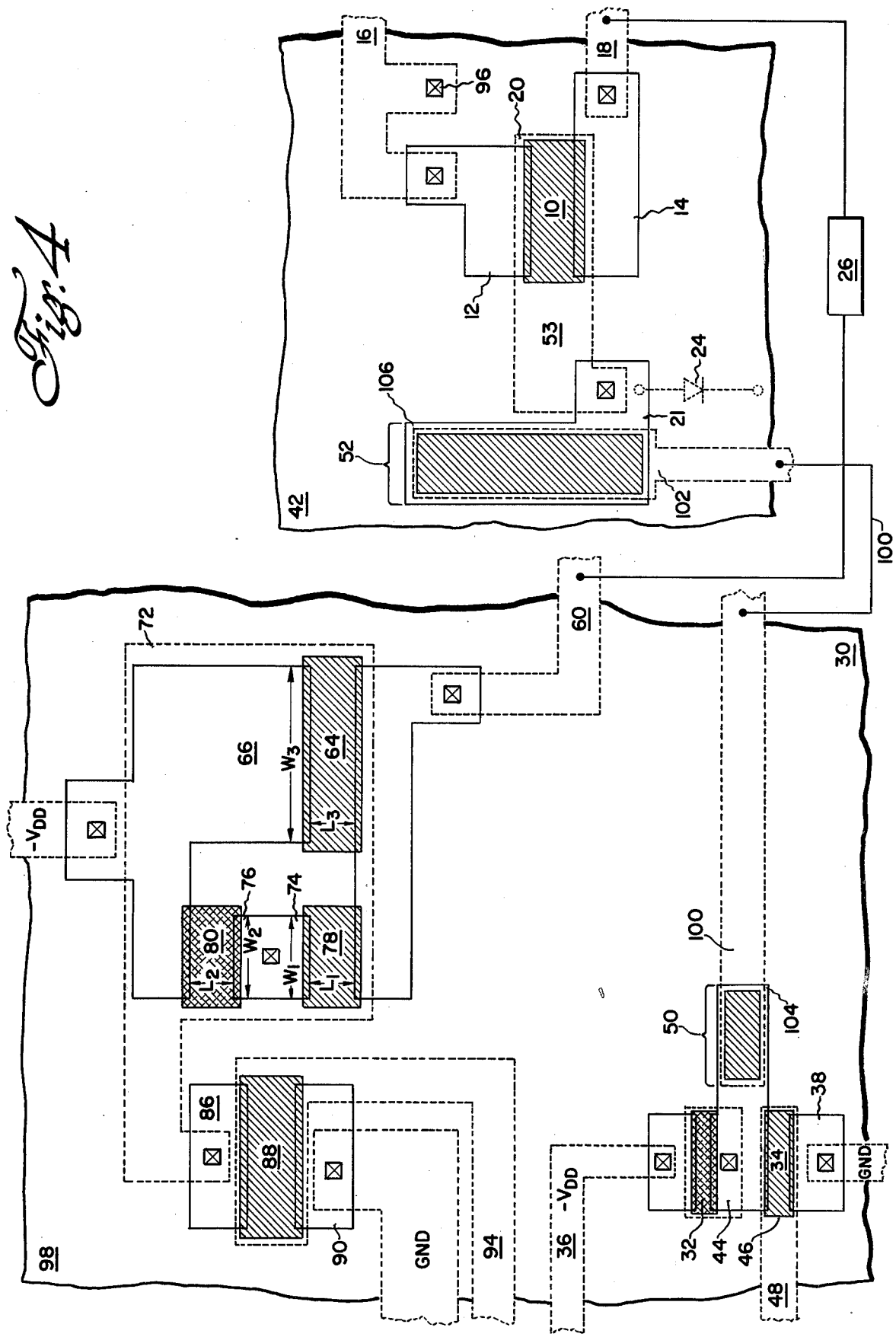
FIG. 4 is a layout drawing of an exemplary MOS implementation of a gas discharge display system in accordance with this invention.

FIG. 4 illustrates presently preferred physical embodiment of a gas discharge display driver in accordance with this invention. The structure of FIG. 4 includes two substantially isolated semiconductor devices having a single control connection 100 and gas discharge display device 26 connected therebetween. In accordance with convention, the different structural elements of the devices of FIG. 4 are illustrated by different line types. The dotted lines represent aluminum metallizations which it will be understood are generally formed over thick or thin oxide layers and contact impurity regions which are conventionally formed by diffusion into a substrate, through holes extending through the oxide layer. These holes are indicated herein by boxed-in x's. The shaded areas represent thin oxide while the cross-hatched areas represent ion implanted regions lying below thin oxide. The regions of opposite conductivity type to the substrate are indicated by solid lines. The physical embodiment of FIG. 4 corresponds substantially to the circuit diagram of FIG. 3 and to the extent possible like reference numerals denote like elements. Th significant device dimensions are illustrated at FIG. 4, especially $L_1$ and $W_1$, $L_2$ and $W_2$, and $L_3$ and $W_3$. It will be appreciated that circuit portion 30 and circuit portion 98 while fabricated on the same semiconductor substrate are substantially isolated from each other having no direct connection therebetween. It will be appreciated, however, that the source of voltage $-V_{DD}$ may be a common source. Diode 24 which is illustrated schematically will be appreciated not to be a separate physical diode but rather to be the natural junction diode formed between impurity region 21 and the semiconductor substrate. Connection between terminal 16 and the cathode of diode 24 is made at contact hole 96. The structure of capacitors 50 and 52 is preferably such that the total breakdown voltage thereof is sufficient to withstand the difference in voltage between the two semiconductor devices which is on the order of 160 volts. Accordingly, the thin oxide which together with aluminum electrodes 100 and 102 and semiconductor regions 104 and 106 comprise capacitors 50 and 52 may appropriately be made thicker than the other regions of thin oxide utilized for fabricating the devices which withstand somewhat higher voltages.

While the present invention has been described with reference to several preferred embodiments thereof, many variations and modifications will now become apparent to those skilled in the art. It is my intent, therefore, to be limited not by the scope of the present disclosure herein, but only by the scope of the appending claims.

What is claimed is:

1. A semiconductor switching circuit for switching between a higher and a lower voltage comprising:
    a first transistor having a breakdown voltage substantially equal to the difference between said higher and said lower voltages and less than said higher voltage, said transistor including a control electrode and first and second current carrying electrodes; and
    control means connected to said control electrode for alternately switching said first transistor between a first current carrying state when said transistor is turned on and a breakdown state when said transistor is off.

2. The circuit of claim 1 wherein said first transistor comprises a metal-oxide-semiconductor field effect transistor including a gate electrode, a source electrode and a drain electrode; said source electrode adapted to be connected to a source of voltage equal to said higher voltage and said drain electrode adapted to be connected to a device to be operated by said switching circuit.

3. The circuit of claim 2 further comprising diode means including an anode and a cathode, said anode connected to said gate electrode and said cathode connected to said source electrode of said metal-oxide-semiconductor field effect transistor.

4. The circuit of claim 3 wherein said control means comprises semiconductor switching means including one or more switching transistors operating at a voltage less than either of said higher and said lower voltages; and
    capacitor means connecting said control means with said gate electrode of said first transistor.

5. The circuit of claim 4 wherein said capacitor means comprises metal-oxide-semiconductor capacitor means.

6. The circuit of claim 5 wherein said first transistor and said diode means comprise integrated circuit transistor means and diode means fabricated on a single semiconductor substrate; and wherein said control means comprises integrated circuit control means fabricated on a second semiconductor substrate isolated from said first semiconductor substrate.

7. The device of claim 6 wherein said capacitor means comprises first metal-oxide-semiconductor capacitor means on said first substrate and second metal-oxide-semiconductor capacitor means on said second substrate and means connecting said first and second capacitor means.

8. The device of claim 6 wherein sad capacitor means comprises discrete capacitor means external to said first and second substrates.

9. The circuit of claim 1 further comprising:
   gas discharge display means having a first terminal connected to said first transistor;
   a controlled current sink comprising:
   a main current carrying transistor having first and second current carrying electrodes and a control electrode for regulating the amount of current in said main current carrying transistor;
   a first enhancement mode field effect transistor connected between said control electrode and said first current carrying electrode of said main current carrying transistor;
   a second depletion mode field effect transistor connected between said control electrode and said second current carrying electrode of said main current carrying transistor; each of said first enhancement mode field effect transistor and said second depletion mode field effect transistor including a gate terminal, said gate terminals commonly connected and connected to said control terminal of said main current carrying transistor; and
   means for selectively grounding said control terminal of said main current carrying transistor; said main current carrying transistor connected to a second terminal of said gas discharge display means.

* * * * *